(12) United States Patent
Besling

(10) Patent No.: US 8,349,726 B2
(45) Date of Patent: Jan. 8, 2013

(54) METHOD FOR FABRICATING A STRUCTURE FOR A SEMICONDUCTOR DEVICE USING A HALOGEN BASED PRECURSOR

(75) Inventor: Wim Besling, Eindhoven (NL)

(73) Assignee: NXP B.V., Eindhoven (NL)

( * ) Notice: Subject to any disclaimer, the term of this patent is extended or adjusted under 35 U.S.C. 154(b) by 300 days.

(21) Appl. No.: 12/067,494

(22) PCT Filed: Sep. 15, 2006

(86) PCT No.: PCT/IB2006/053316
§ 371 (c)(1),
(2), (4) Date: Aug. 6, 2008

(87) PCT Pub. No.: WO2007/034391
PCT Pub. Date: Mar. 29, 2007

(65) Prior Publication Data
US 2008/0299765 A1    Dec. 4, 2008

(30) Foreign Application Priority Data

Sep. 23, 2005   (EP) .................................. 05300768

(51) Int. Cl.
*H01L 21/4763* (2006.01)
*H01L 21/44* (2006.01)
(52) U.S. Cl. ........ 438/637; 438/653; 438/680; 438/681; 257/E21.584

(58) Field of Classification Search .................. 438/637; 257/E21.584
See application file for complete search history.

(56) References Cited

U.S. PATENT DOCUMENTS

| | | | |
|---|---|---|---|
| 6,468,906 B1* | 10/2002 | Chan et al. ................... 438/687 |
| 2002/0173157 A1* | 11/2002 | Chang et al. ................. 438/700 |
| 2003/0001264 A1* | 1/2003 | Naik ............................. 257/751 |
| 2003/0176058 A1* | 9/2003 | Weidman et al. ............ 438/638 |
| 2003/0180458 A1* | 9/2003 | Sneh .......................... 427/248.1 |
| 2004/0000722 A1* | 1/2004 | Powers ........................ 257/774 |
| 2004/0082164 A1* | 4/2004 | Chen et al. ................... 438/633 |
| 2004/0152300 A1* | 8/2004 | Shim ........................... 438/637 |
| 2005/0082606 A1* | 4/2005 | Grunow et al. .............. 257/330 |
| 2005/0101123 A1* | 5/2005 | Kumada et al. .............. 438/637 |
| 2005/0153496 A1* | 7/2005 | Ngo et al. .................... 438/197 |
| 2005/0277298 A1* | 12/2005 | Lin et al. ..................... 438/687 |
| 2006/0060956 A1* | 3/2006 | Tanikella ..................... 257/686 |
| 2006/0154493 A1* | 7/2006 | Arghavani et al. ........... 438/786 |

FOREIGN PATENT DOCUMENTS

| WO | 02063677 A1 | 8/2002 |
| WO | 03056612 A1 | 7/2003 |

* cited by examiner

*Primary Examiner* — Kevin Parendo

(57) ABSTRACT

There is described a method of fabricating a dual damascene structure for a semiconductor device. A halogen based precursor is used during vapor deposition of a diffusion barrier layer in a trench or via formed in a substrate. Residual halogen from the deposition is allowed to remain on the barrier layer and is used to catalyse growth of a metal layer on the barrier layer to fill the trench or via.

24 Claims, 3 Drawing Sheets

METHOD FOR FABRICATING A STRUCTURE FOR A SEMICONDUCTOR DEVICE USING A HALOGEN BASED PRECURSOR

The present invention relates to a method of fabricating a structure, in particular but not exclusively, for a semiconductor device.

The density of transistors on high performance integrated circuits (Ics) is steadily increasing. The integration of many active elements has necessitated that such ICs feature multiple layers of high density metal interconnects.

Recently, the semiconductor industry has moved away from using aluminum interconnect metal with Silicon Dioxide dielectric between the metal lines, to using Copper metal and low-k dielectric materials.

Copper reduces the resistance of the metal interconnect lines while low-k dielectrics reduce the parasitic capacitance between the metal lines. These new materials have been employed in a fabrication process called "Dual Damascene" which is used to create the multi-level, high density metal interconnections needed for advanced, high performance ICs.

Atomic layer deposition (ALD) and chemical vapour deposition (CVD) are well known techniques which may be used to deposit conformal copper diffusion barriers and also copper seed layers in dual damascene type structures.

A diffusion barrier is a protective layer deposited on the walls of a trench or via formed for example in a di-electric material, such as the low K materials mentioned above, and which prevents metal, for example copper, used to fill the trench or via during manufacture, diffusing into the di-electric material. A diffusion barrier may for example be formed of TiN.

A metal seed layer is a layer of metal, for example copper, typically deposited over a diffusion barrier in a trench or via, which facilitates the subsequent complete filling of the trench or via with the metal.

Embodiments of the present invention aim to provide a convenient method by which one layer may be grown upon another layer in a structure for a semiconductor device.

According to the present invention there is provided a method of fabricating a structure for a semiconductor device, in which method, a halogen based pre-cursor is used during deposition of a first layer of material on a substrate and wherein residual halogen from the deposition is used to catalyse growth of a second layer of material on the first layer.

In one embodiment, the first layer of material is a diffusion barrier layer deposited on the bottom and/or side walls of a trench or via defined in the substrate.

The second layer of material may be a metallic layer which the residual halogen catalyses the growth of as the second layer fills the trench or via.

Preferably, the halogen based precursor is iodine or bromine based.

An embodiment of the invention will now be described by way of example only with reference to the accompanying drawings in which:

FIGS. 1 to 5 illustrate steps in the manufacturing of an interconnect structure.

Figure 1:
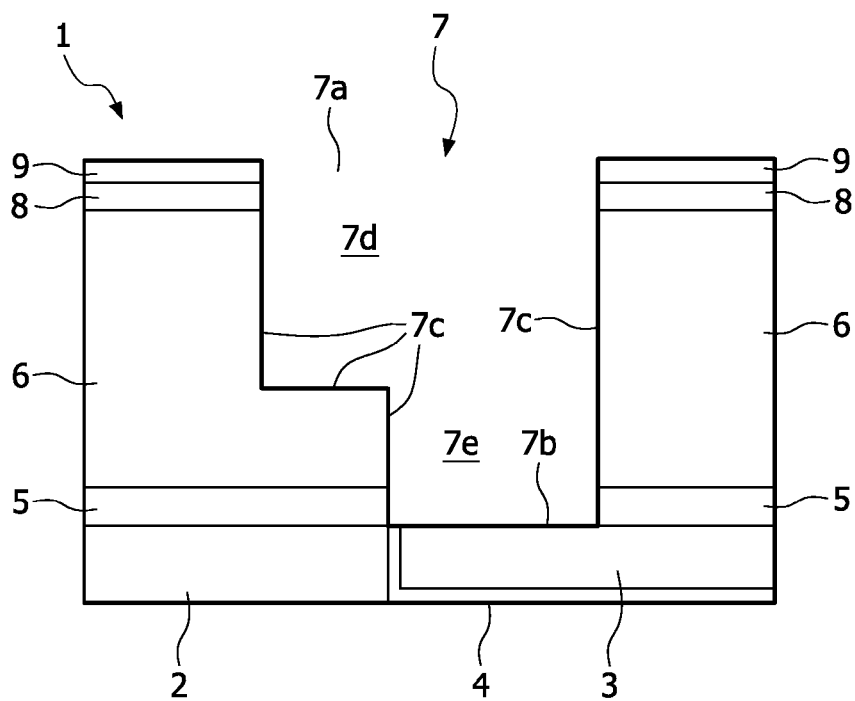

Referring to FIG. 1 of the accompanying drawings there is illustrated a part formed damascene structure 1. The structure 1 comprises a first dielectric layer 2 formed of dielectric material, in this example ultra low K material. Which is adjacent to a first metal layer 3, in this example copper. A thin barrier layer 4, for example formed of conductive TiN, separates the dielectric layer 2 and the first metal layer 3.

An etch stop layer 5, for example, formed from SiCN covers the first dielectric layer 2 and partly covers the first metal layer 3.

A second dielectric layer 6 comprising the ultra low K material is formed on the etch stop layer 5. The second dielectric layer 6 contains a passage 7 having an open end 7a and a closed end 7b closed by the first metal layer 3. The wall(s) 7c of the passage define a first passage portion or trench 7d having the open end 7a and a second passage portion or via 7e having the closed end 7b. The first passage portion 7d is wider than the second passage portion 7e.

A USG hard mask layer 8 is formed on an upper surface of the second dielectric layer 6. A TiN hard mask layer is 9 is formed on the USG hard mask layer 8.

The structure 1 is fabricated using known standard techniques. Briefly, the low k layers are deposited with or without intermediate and top hard masks. Resists are spun and lithographically exposed. The resists are patterned, the hard masks etched and then the resists are removed. The porous low K material and the layer 5 are then etched to form the passageway 7.

Figure 2:
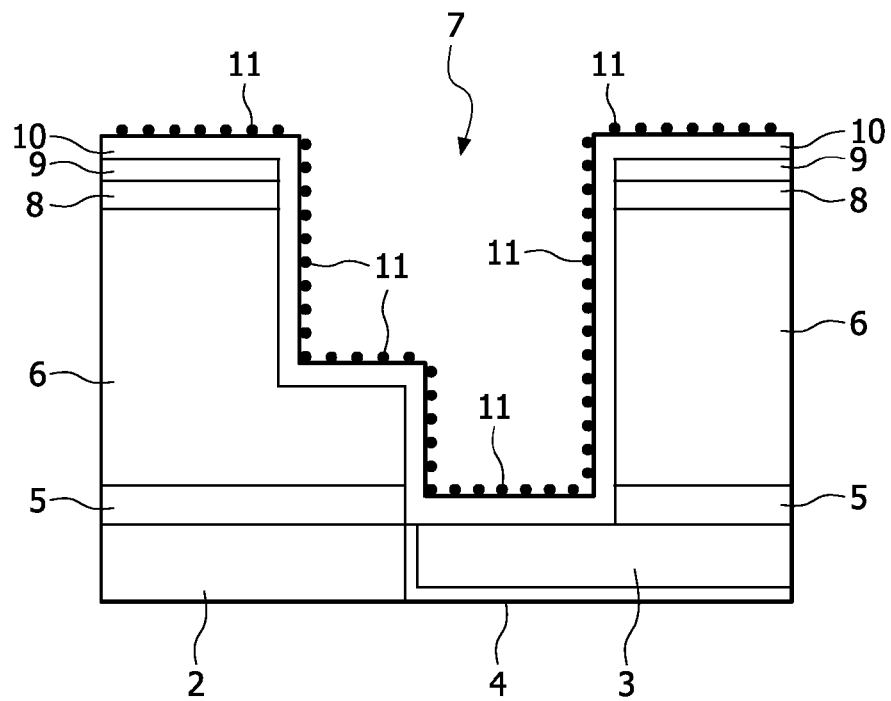
Figure 3:
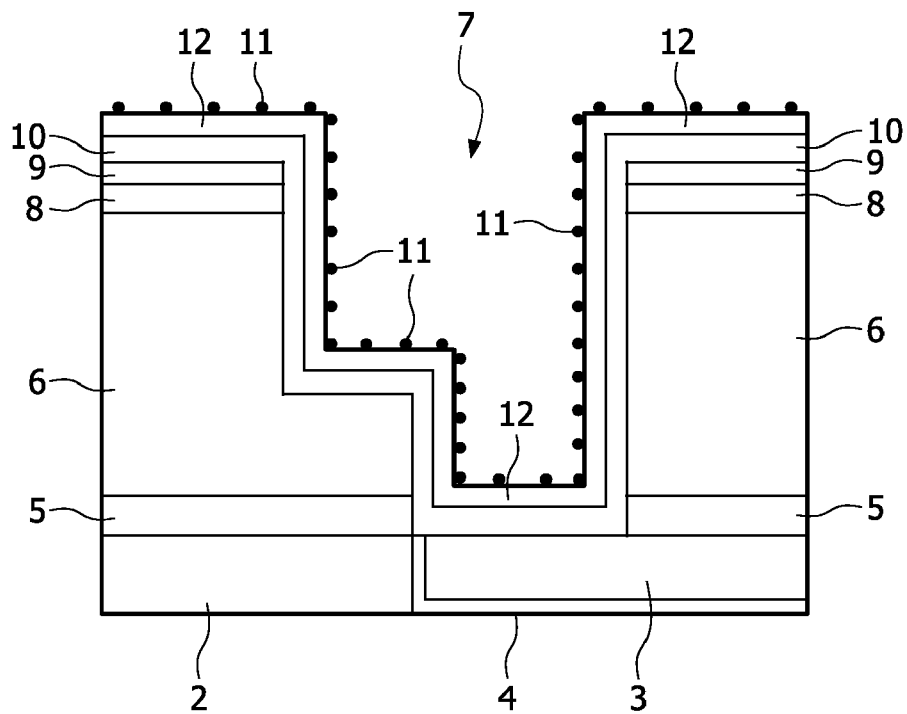

Referring now to FIG. 2, a diffusion barrier layer 10 is deposited over the walls of the passage 7 and the first metal layer 3 that closes the passage 7. In a preferred example the barrier layer 10 comprises TiN. The barrier layer 10 is deposited using a halide based precursor, (a Ti halide precursor if the layer 9 is TiN) and preferably using ALD or CVD. Advantageously, halide species 11 from the precursor remain on the surface of the barrier layer 10 after the deposition of the barrier layer 10 is complete. These halide species serve to catalyse the subsequent deposition of a metal layer 12, see FIG. 3, in a preferred embodiment copper deposited using CVD.

In a preferred embodiment, ALD is used to grow the barrier layer 10. ALD utilises alternating pulses of two or more precursors separated from each other by a purge pulse consisting of an inert gas. By reactive adsorption to the surface, growth occurs in a sub mono-layer by sub mono-layer fashion. During each pulse the growth is self limiting because of occupancy of active sites. The consequences are threefold: 1) A very uniform and conformal growth behaviour is obtained, 2) The monolayer by sub monolayer growth behaviour allows full control over the total stack thickness just by setting the amount of cycles, 3) There are low in film contamination levels because reaction products are completely removed from the surface during each pulse sequence.

In a preferred embodiment of the present invention, Atomic Layer Deposition of TiN is carried out by using titanium iodide ($TiI_4$) and ammonia ($NH_3$) as precursors at a deposition temperature of 250-400° C. The ALD technique is based on the principle that the gaseous reactants used in the CVD process are made to react with the wafer surface one at the time. The deposition sequence in the preferred embodiment is as follows. A suitable apparatus for performing the deposition is described in WO02/063677.

First, one of the reactants is introduced into a reaction chamber. This precursor reacts with the surface such that a chemical bonding with the substrate atoms takes place. The conditions in terms of temperature, pressure, etc. are selected such that only one monolayer or sub monolayer of new material is grown on the surface; condensation or decomposition of additional precursor material does not take place under the chosen conditions. The precursor flow is maintained long enough such that the chemisorbed monolayer is present everywhere on the surface, also in deep vias, around corners, etc. The chemisorbed monolayer results in a new surface termination, characteristic for the specific precursor used.

E.g. the surface termination of a silicon dioxide surface consists of Si—OH groups. When this surface is exposed to $TiI_4$ vapour, Si—O—Ti(I) bonds will be formed and HI(g) will be released.

Secondly, an inert purge gas is introduced into the chamber that removes all gaseous precursor molecules (i.e. $TiI_4$) used in the first step. The purge gas, e.g. $N_2$ or Ar, is kept flowing sufficiently long to ensure a complete removal of the first type of precursor. As the monolayer grown in the first step is chemisorbed, the purge gas does not remove this layer.

Thirdly, a second precursor is introduced into the chamber. The type of precursor, $NH_3$ in this example, is selected such that it reacts with the monolayer grown in the first step to form an additional layer. This is done to avoid a pile up of halogens on the interface affecting adhesion and reliability performance. In the ALD TiN example, this leads to the formation of (gaseous) HI, while the surface now has a —O—Ti—$NH_2$ termination. Again, the reaction will proceed until all available iodide atoms on the —O—$TiI_3$ surface sites are replaced by —Ti—$NH_2$ groups. Also in this step, the flow of reactant gas is kept going long enough to ensure that all surface sites have reacted; at the same time, the conditions are such that no condensation takes place.

The fourth step is another purge with inert gas that removes all excess gas remaining from the third step.

In the subsequent step, the first precursor is introduced again (i.e. $TiI_4$). This precursor reacts with the molecules chemisorbed in the third step, i.e. with the —Ti—$NH_2$ groups. This results in the formation of gaseous HI, and a surface terminated with —N—Ti(I)$_x$ groups.

Each of the four basic steps is repeated multiple times, until a TiN film with the desired thickness has been realized.

Although the use of metal halide precursors (and a Ti halide in particular) to grow layers in this way is known, it is normal practice to remove any halide remaining on the surface of the completed layer by application of a final $NH_3$ ALD half cycle. This is done to improve adhesion. Additionally, it is standard to apply further a surface treatment, for example, a plasma anneal to improve the interface and ensure complete removal of any halide.

Contrary to this, in embodiments of the present invention, as mentioned above, halide is allowed to remain at the surface of the barrier to catalyse the subsequent growth of metal layer, for example Copper.

In a preferred embodiment, the copper layer 12 is deposited using CVD with Cupraselect® Cu(hfac)(tmvs) a well known precursor widely used for depositing MOCVD copper films. During the growth of the copper layer 12, residual iodine ions 11 left from the step of depositing the barrier layer 10, float to the top of the copper layer 12 and do not get buried within the growing film. The presence of iodine catalyses the reduction of adsorbed $Cu^+$ (hfac) molecule into copper giving rise to a growth rate that is larger than without using iodine.

A process by which iodine may catalyse the growth of a Cu layer is described in detail in WO2003056612. This process includes the step of depositing ethyl iodide to provide the catalyst. This is to be contrasted with embodiments of the invention in which the catalyst is residual halogen from a halogen pre-cursor used to deposit a first later of material.

Figure 4:
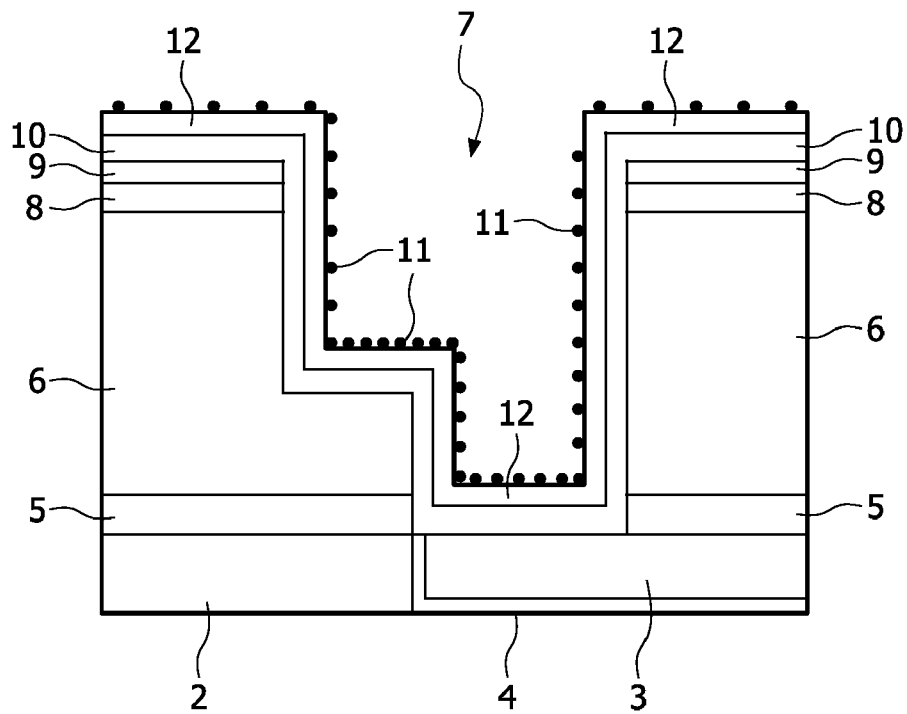

As illustrated in FIG. 4, conformal filling of the copper layer 12 arises because of the larger concentration of catalytic species on the bottom of the passage portions 7d and 7e when the Copper layer 12 starts to grow.

After the deposition of a copper seed layer in this way, the layer 12 may be completed using electrochemical plating.

Figure 5:
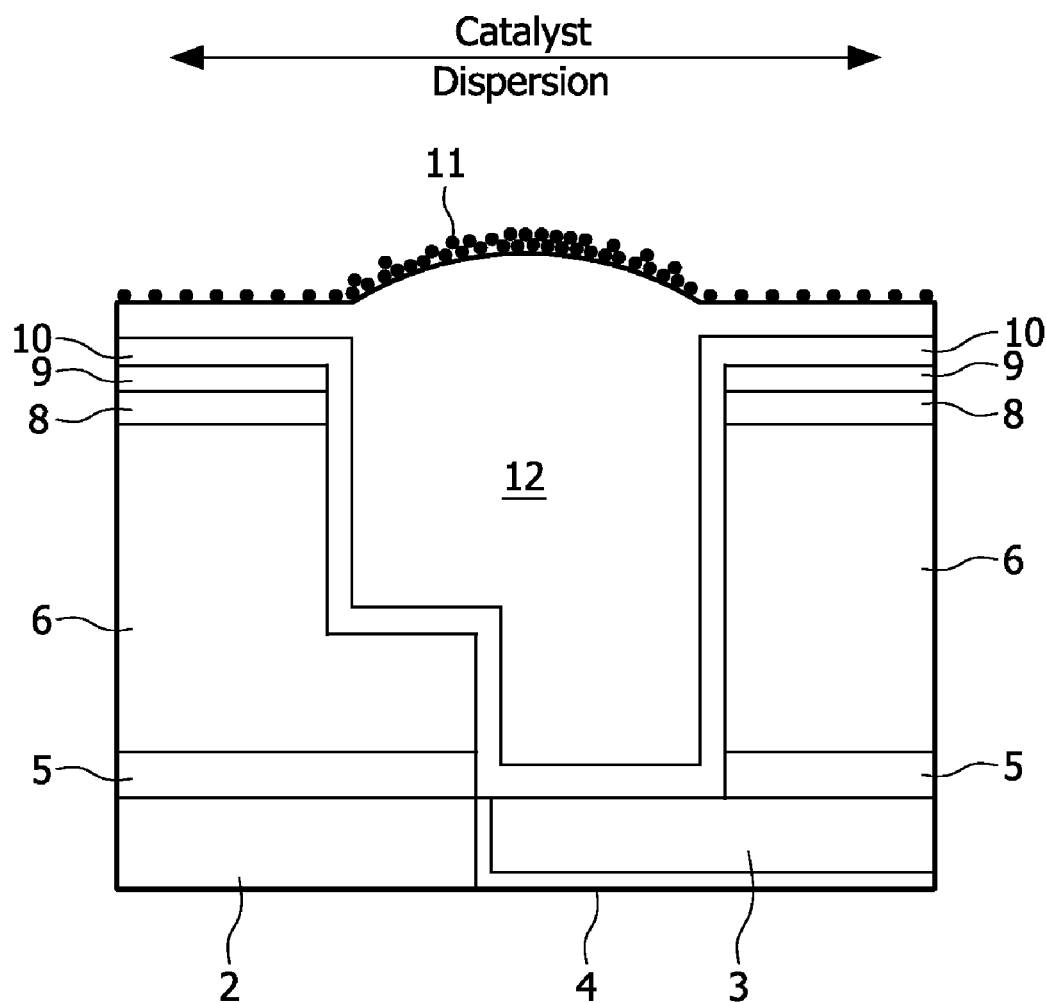

As illustrated in FIG. 5, remaining catalytic species may be dispersed either in the electrochemical bath or in a simple rinse step.

Although in the preferred embodiment, an iodine based precursor is used, different halide based precursors may be used in other embodiments of the invention. However, iodine based pre-cursors are preferred over chlorine based pre-cursors for ALD TiN barrier deposition because a gaseous HCl by-product released during the $TiCl_4$ pulse, is able to etch underlying copper due to the formation of volatile CuCl gas. This may cause severe pitting on copper lines or films. The release of the CuCl gas may also cause the additional problem of the re-deposition of copper on the reactor walls and the incorporation of copper inside the TiN diffusion barrier degrading the barrier's diffusion.

The use of iodine based precursors is also preferred over fluorinated precursors which may also be problematical. It is well known for example that the use of $WF_6$ is problematical when used in combination with oxide surfaces because of the etching of $SiO_2$ by HF. The use of $WF_6$ as a precursor for barrier layer deposition on low-k dielectrics would not be ideal since these materials have a high concentration of Si—O—Si bonds.

Thus in embodiments involving the manufacture of a damascene structure it is preferable to use halide precursors that do not form volatile by-products that react with other materials used in interconnect manufacturing. Iodine and bromine based pre-cursors, for example, metal iodide and metal bromide based precursors comply with this requirement. In general, an iodide precursor is preferred over a bromine precursor when a trench or via is to be filled with copper because iodine has an enhanced catalytic action to start a super-conformal copper fill process.

Iodide based pre-cursors are also preferred over chloride or fluoride based pre-cursors because iodine will float on copper during catalytic Cu DVD. Chloride or fluoride precursors are more likely to remain attached to the diffusion layer/copper interface and thus degrade yield and via resistance.

A further advantage of using iodine pre-cursors is their relative bulkiness which results in a limited precursor penetration inside porous low-k dielectrics.

Having thus described the present invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements.

It will be apparent to a person skilled in the art that the various embodiments as described and/or claimed can be combined, without departing from the scope of the invention.

The invention claimed is:

1. A method of fabricating a structure for a semiconductor device, the method comprising,
    forming a second low-k dielectric layer, having an upper surface, on an etch stop layer, the etch stop layer formed on and covering a first low-k dielectric layer and a covered portion of a first metal layer;
    etching a via in the second low-k dielectric layer, wherein the via aligns with an exposed portion of the first metal layer not covered by the etch stop layer, and wherein the via has sidewalls that extend from the upper surface of the second low-k dielectric layer to the first metal layer;

depositing a first layer of material on the exposed portion of the first metal layer and on the sidewalls of the via using an atomic layer deposition process that includes alternating pulses of the first and second precursors, at least one of which includes a halogen, the pulses of the first and second precursors separated from each other by a purge pulse consisting of an inert gas; and using residual halogen from the deposition of the first layer of material to catalyse growth of a second layer of material on the first layer.

2. A method according to claim 1 wherein the first layer of material is a diffusion barrier layer.

3. A method according to claim 1 wherein the second layer of material is a metallic layer.

4. A method according to claim 3 wherein the second layer of material comprises copper.

5. A method according to claim 1 wherein the second layer of material is a metallic layer and the residual halogen catalyses growth of the second layer as the second layer fills the via.

6. A method according to claim 1 wherein the second layer is deposited using vapour deposition.

7. A method according to claim 6 wherein the second layer is deposited using atomic layer deposition or chemical vapour deposition.

8. A method according to claim 1 wherein the first precursor is iodine based or bromine based.

9. A method according to claim 1 wherein the first layer of material comprises TiN.

10. A method according to claim 1 wherein the structure is an interconnect structure.

11. A method according to claim 1, further including depositing a hard mask layer on the upper surface of the second dielectric layer, the hard mask layer remaining in place during the deposition of the first and second layers of material.

12. A method according to claim 1, wherein etching the via includes etching a first portion and a second portion of the via, the first portion extending from the upper surface of the second dielectric layer to the first metal layer, and the second portion extending from the upper surface of the second low-k dielectric layer to an exposed surface of the second low-k dielectric layer, the exposed surface of the second low-k dielectric layer located between the etch stop layer and the upper surface of the second low-k dielectric layer.

13. A method according to claim 1, wherein the material of the first low-k dielectric layer is a low-k material that is porous.

14. The method of claim 1, wherein the atomic layer deposition process includes:

introducing the first precursor into an Atomic Layer Deposition (ALD) reaction chamber;

following the introduction of the first precursor, introducing a first inert purge gas into the ALD chamber to remove the first precursor from the ALD chamber;

introducing the second precursor to the ALD reaction chamber; and following the introduction of the second precursor, introducing a second inert purge gas into the chamber to remove the second precursor from the ALD reaction chamber, and introducing the first precursor to the ALD reaction chamber to form the first layer of material with a halide on the surface of the first layer of material.

15. The method of claim 14, wherein the first inert purge gas is the same type as the second inert purge gas.

16. A method of fabricating a structure for a semiconductor device, the method comprising:

forming a second low-k dielectric layer, having an upper surface, on an etch stop layer, the etch stop layer formed on and covering a first low-k dielectric layer and a covered portion of a first metal layer;

etching a via in the second low-k dielectric layer, wherein the via aligns with an exposed portion of the first metal layer not covered by the etch stop layer, and wherein the via has sidewalls that extend from the upper surface of the second low-k dielectric layer to the first metal layer;

depositing a first layer of material on the exposed portion of the first metal layer and on the sidewalls of the via by performing Atomic Layer Deposition of TiN using titanium iodide ($TiI_4$) and ammonia ($NH_3$) as precursors by performing the steps including:

introducing a first precursor into an Atomic Layer Deposition (ALD) reaction chamber;

following the introduction of the first precursor, introducing a first inert purge gas into the ALD chamber to remove the first precursor from the ALD chamber;

introducing a second precursor to the ALD reaction chamber; and following the introduction of the second precursor, introducing a second inert purge gas into the chamber to remove the second precursor from the ALD reaction chamber, and introducing the first precursor to the ALD reaction chamber to form the first layer of material with a halide on the surface of the first layer of material; and using residual halogen from the deposition of the first layer of material to catalyse growth of a second layer of material on the first layer.

17. The method of claim 16, further including: following the introduction of the first precursor to form the first layer of material with the halide on the surface of the first layer of material, introducing a third inert purge gas into the ALD reaction chamber to remove the first precursor from the ALD chamber, the resulting first layer of material having the halide on the surface.

18. The method of claim 17, wherein the first, second, and third inert purge gases are the same type of inert purge gas.

19. The method of claim 16, wherein the first precursor includes a form of $TiI_4$ and the second precursor includes a form of $NH_3$.

20. A method of fabricating a structure for a semiconductor device, the method comprising:

forming an etch stop layer on and covering a first low-k dielectric layer and a first portion of a first metal layer;

forming a second low-k dielectric layer, having an upper surface, on the etch stop layer;

etching a first portion of a via in the second low-k dielectric layer, the first portion of the via extending from the upper surface of the second low-k dielectric layer to the first metal layer, the first portion of the via aligned with a second portion of the first metal layer;

etching a second portion of the via in the second low-k dielectric layer extending from the upper surface of the second dielectric layer to an exposed surface of the second low-k dielectric;

depositing a first layer of material on the second portion of the first metal layer and on the sidewalls of the via using an atomic layer deposition process that includes alternating pulses of the first and second precursors, at least one of which includes a halogen, the pulses of the first and second precursors separated from each other by a purge pulse consisting of an inert gas; and using residual halogen from the deposition of the first layer of material to catalyse growth of a second layer of material on the first layer.

21. The method of claim 20, wherein the etch stop layer of the structure is not located on the second portion of the first metal layer.

22. The method of claim 20, wherein etching the first portion of the via does not include etching the etch stop layer above the first low-k dielectric layer.

23. The method of claim 20, wherein the first portion of the via has a width equal to the width of the second portion of the first metal layer.

24. The method of claim 20 wherein the second low-k dielectric layer is a porous low-k dielectric material.

* * * * *